United States Patent
Kawada

(10) Patent No.: US 11,600,702 B2
(45) Date of Patent: Mar. 7, 2023

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yasuyuki Kawada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 7 days.

(21) Appl. No.: 17/334,002

(22) Filed: May 28, 2021

(65) Prior Publication Data

US 2022/0013641 A1    Jan. 13, 2022

(30) Foreign Application Priority Data

Jul. 8, 2020   (JP) .............................. JP2020-118064

(51) Int. Cl.
   *H01L 29/16*   (2006.01)
   *H01L 29/66*   (2006.01)
   *H01L 29/51*   (2006.01)
   *H01L 29/423*  (2006.01)

(52) U.S. Cl.
   CPC ...... *H01L 29/1608* (2013.01); *H01L 29/4236* (2013.01); *H01L 29/518* (2013.01); *H01L 29/6606* (2013.01)

(58) Field of Classification Search
   CPC ............. H01L 29/1608; H01L 29/4236; H01L 29/518; H01L 29/6606; H01L 29/045; H01L 21/049; H01L 29/513; H01L 29/1095; H01L 29/0623; H01L 29/0878; H01L 29/66068; H01L 29/7813
   See application file for complete search history.

(56) References Cited

U.S. PATENT DOCUMENTS 10,566,426 B2 *   2/2020   Mauder ............... H01L 29/7802
2021/0013039 A1   1/2021   Onishi et al.

FOREIGN PATENT DOCUMENTS

JP   4549167 B2      9/2010
JP   2019-145570 A   8/2019

* cited by examiner

*Primary Examiner* — Cuong B Nguyen
(74) *Attorney, Agent, or Firm* — Rabin & Berdo, P.C.

(57) ABSTRACT

A silicon carbide semiconductor device includes a silicon carbide semiconductor substrate of a first conductivity type, a first semiconductor layer of the first conductivity type, a second semiconductor layer of a second conductivity type, first semiconductor regions of the first conductivity type, trenches, a gate insulating film, gate electrodes, and an interlayer insulating film. The gate insulating film is formed by performing nitriding and oxidation by at least two sessions of a heat treatment by a mixed gas containing nitric oxide and nitrogen, the gate insulating film being configured by a first gate insulating film that is a silicon nitride layer, a second gate insulating film that is a silicon oxide film, and a third gate insulating film that is a silicon oxide film having a nitrogen area density lower than that of the second gate insulating film.

10 Claims, 11 Drawing Sheets

FIG.3

| | N AREA DENSITY OF INTERFACE (XPS) | N CONCENTRATION OF INTERFACE (SIMS) | N CONCENTRATION IN HTO FILM (SIMS) | DISTRIBUTION OF N CONCENTRATION IN HTO FILM |
|---|---|---|---|---|
| EMBODIMENT | $5.7 \times 10^{14}/cm^2$ | $7.1 \times 10^{20} atoms/cm^3$ | $5 \times 10^{18}$ TO $2 \times 10^{20}$ atoms/cm$^3$ | CONCENTRATION HIGH TOWARD INTERFACE, CONCENTRATION LOW TOWARD SURFACE |
| FIRST CONVENTIONAL EXAMPLE | $3.7 \times 10^{14}/cm^2$ | $7.3 \times 10^{20} atoms/cm^3$ | $8 \times 10^{18}$ TO $1 \times 10^{20}$ atoms/cm$^3$ | CONCENTRATION HIGH TOWARD INTERFACE, CONCENTRATION LOW TOWARD SURFACE |
| SECOND CONVENTIONAL EXAMPLE | $3.0 \times 10^{14}/cm^2$ | $4.5 \times 10^{20} atoms/cm^3$ | $1.5 \times 10^{20}$ TO $3 \times 10^{20} atoms/cm^3$ | CONCENTRATION SUBSTANTIALLY UNIFORM FROM INTERFACE TO SURFACE |

FIG.4

|  | THRESHOLD VOLTAGE (V) | MOBILITY (cm²/Vs) |
|---|---|---|
| EMBODIMENT | 5.19 | 67.1 |
| FIRST CONVENTIONAL EXAMPLE | 4.06 | 76.3 |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2020-118064, filed on Jul. 8, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A planar gate structure is a MOS gate structure in which a MOS gate is provided in a flat plate-like shape on the front surface of a semiconductor substrate. A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost.

FIG. 12 is a cross-sectional view depicting a trench gate structure of a conventional silicon carbide semiconductor device. The structure of the conventional silicon carbide semiconductor device is described taking a trench-type SiC-MOSFET as an example. In the trench gate structure, on a front surface of an $n^+$-type silicon carbide substrate (not depicted), an $n^-$-type silicon carbide epitaxial layer (not depicted) is deposited. At a surface of the $n^-$-type silicon carbide epitaxial layer, opposite a surface thereof facing the $n^+$-type silicon carbide substrate, an $n^-$-type high-concentration region 105 is provided. In the n-type high-concentration region 105, a first $p^-$-type base region 103 is selectively provided so as to underlie an entire area of a bottom of a trench 116.

A MOS gate having a trench gate structure is configured by a p-type silicon carbide epitaxial layer 106, an $n^+$-type source region 107, a $p^+$-type contact region (not depicted), the trench 116, a gate insulating film 109, and a gate electrode (not depicted). The $p^+$-type contact region may be omitted.

FIG. 13 is a flowchart of a method of manufacturing the gate insulating film of the conventional silicon carbide semiconductor device. In the MOS gate having a trench gate structure, in the method of manufacturing the gate insulating film 109, first, an oxide film is deposited by a chemical reaction (chemical vapor deposition method) such as that for a high temperature oxide (HTO) or thermal oxidation at a temperature of about 1000 degrees C., under an oxygen atmosphere (step S21).

In the trench-type SiC-MOSFET, a state of an interface between the oxide film ($SiO_2$) and silicon carbide (SiC) affects device characteristics. While a $SiO_2$ film is good as a thermal oxide film, in an instance in which SiC is oxidized, excess carbon (C) occurs whereby the $SiO_2$/SiC interface is adversely affected, causing the device characteristics to degrade and therefore, a deposited $SiO_2$ film may be used. Nonetheless, for example, a deposited $SiO_2$ film formed by plasma chemical vapor deposition (CVD) or sputtering is unfavorable due to insufficient film density and insulation performance.

Further, a film thickness of the gate insulating film 109 is preferably uniform irrespective of the portion thereof in the trench 116; however, a problem arises in that the film thickness of a deposited $SiO_2$ film formed by plasma CVD or sputtering at the bottom of the trench 116 differs from that at the sidewalls of the trench 116, and even at the sidewalls, portions closer to the opening of the trench 116 tend to be thicker. Therefore, a deposited $SiO_2$ film that is an HTO has a uniform film thickness and relatively good film quality and therefore, normally, is used for the gate insulating film 109 of a trench-type SiC-MOSFET.

Next, an annealing treatment is performed to the oxide film. In a case of formation by thermal oxidation, an interface state density of an interface between the oxide film and a semiconductor portion may be reduced by a heat treatment (post oxidation anneal (POA) treatment). In a case in which the oxide film is formed by a deposition method such as that for an HTO, to improve electrical characteristics (mobility, etc.), in general, after an HTO film is formed, post-annealing such as by a gas containing nitrogen ($N_2$) is performed. For example, NO annealing by a $NO10\%/N_2$ gas is performed for about 30 minutes at a temperature of 1300 degrees C. As a result, the gate insulating film 109 is formed.

Nonetheless, when the silicon carbide substrate is thermally oxidized and the oxide film is formed, some of the carbon in the silicon carbide substrate cannot be sublimated and remains in the oxide film. In particular, the carbon remaining in the oxide film within a range of a few nm from the interface between the silicon carbide substrate and the oxide film is believed to contribute to the generation of charge traps. Such charge traps are believed to cause fluctuation of the threshold voltage when positive bias is applied to the gate electrode.

Therefore, a method of performing thermal oxidation under a nitrogen atmosphere containing a nitric oxide (NO) gas, before the oxide film is deposited is known (for example, refer to Japanese Laid-Open Patent Publication No. 2019-145570). FIG. 14 is a flowchart of an improved method of manufacturing the gate insulating film of the conventional silicon carbide semiconductor device. In this method of manufacturing, first, NO annealing by a NO10%/N$_2$ gas is performed at temperature of 1300 degrees C. for about 30 minutes (step S31). Next, by a CVD method, a deposited film is formed on the surface of the oxide film (step S32). In the gate insulating film 109 formed in this manner, residual carbon is suppressed well and charge traps in the oxide film are reduced well.

SUMMARY OF THE INVENTION

According to an embodiment of the invention, a silicon carbide semiconductor device includes a silicon carbide semiconductor substrate of a first conductivity type, having a first main surface and a second main surface opposite to each other; a first semiconductor layer of the first conductivity type, provided on the first main surface of the silicon carbide semiconductor substrate, and having an impurity concentration lower than an impurity concentration of the silicon carbide semiconductor substrate, the first semiconductor layer having a first surface and a second surface opposite to each other, the second surface facing the silicon carbide semiconductor substrate; a second semiconductor layer of a second conductivity type, provided on the first surface of the first semiconductor layer, the second semiconductor layer having a first surface and a second surface opposite to each other, the second surface of the second semiconductor layer facing the silicon carbide semiconductor substrate; a first semiconductor region of the first conductivity type, selectively provided in the second semiconductor layer at the first surface of the second semiconductor layer; a trench penetrating through the first semiconductor region and the second semiconductor layer, and reaching the first semiconductor layer; a gate insulating film provided in the trench; a gate electrode provided on the gate insulating film in the trench; an interlayer insulating film provided on the gate electrode; a first electrode provided on the second semiconductor layer and the first semiconductor region; and a second electrode provided on the second main surface of the silicon carbide semiconductor substrate. The gate insulating film is configured by a first gate insulating film provided on a surface of a semiconductor body layer, a second gate insulating film provided on a first surface of the first gate insulating film opposite to a second surface of the first gate insulating film facing the semiconductor layer, and a third gate insulating film provided on a first surface of the second gate insulating film opposite to a second surface of the second gate insulating film facing the semiconductor layer, the semiconductor body layer being configured by the first semiconductor region, the second semiconductor layer, and the first semiconductor layer, the first gate insulating film is a silicon nitride layer, the second gate insulating film is a silicon oxide film, and the third gate insulating film is a silicon oxide film having a nitrogen area density lower than a nitrogen area density of the second gate insulating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a table of measurement results for a gate insulating film according to the embodiment and conventional gate insulating films, by secondary ion mass spectrometry and x-ray photoelectron spectroscopy.

FIG. 4 is a table of electrical characteristics of the silicon carbide semiconductor device according to the embodiment and a conventional silicon carbide semiconductor device.

DETAILED DESCRIPTION OF THE INVENTION

Figure 12:
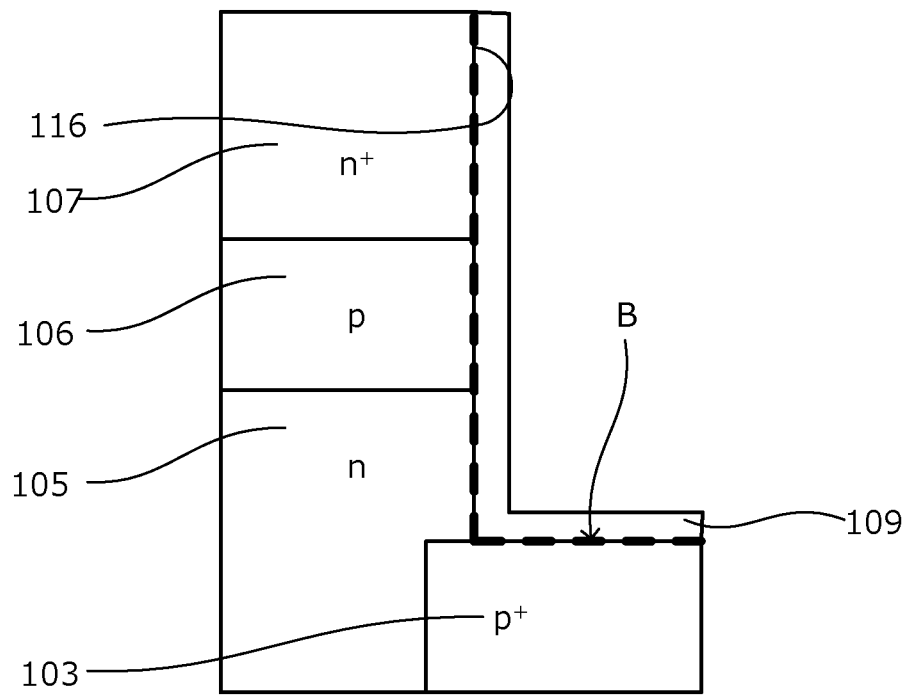
FIG. 12 is a cross-sectional view depicting a trench gate structure of a conventional silicon carbide semiconductor device.

First, problems associated with the conventional techniques are discussed. While the SiO$_2$ film may be formed by an HTO, a gas (NO) contained in a source gas is introduced and therefore, at the initial moment of deposition, the SiC is oxidized and while a minute amount, excess C (carbon clusters) is caused to precipitate. In a case in which the gate insulating film 109 is formed by an HTO, SiC of an interface region (region of dotted-line B in FIG. 12) is oxidized very thinly and excess C occurs at the SiO$_2$/SiC interface. Further, in this portion, crystals at the SiO$_2$/SiC interface are disturbed by the oxidation.

Figure 15:
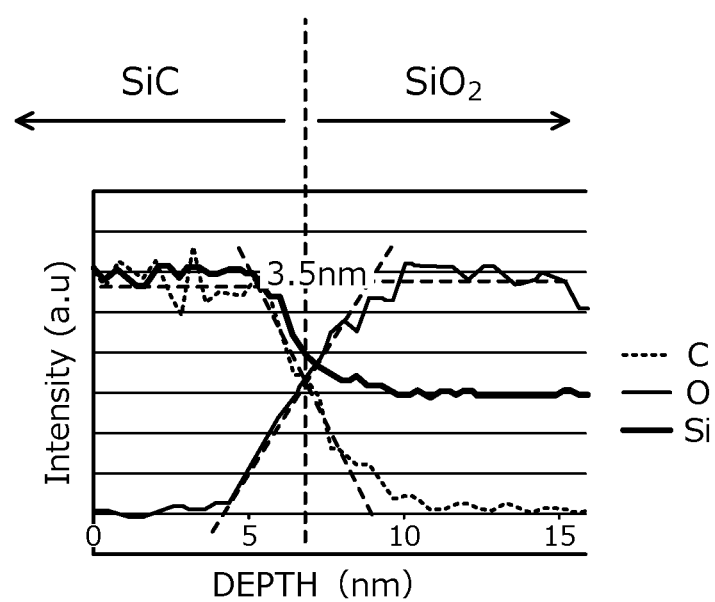
FIG. 15 is a graph showing composition analysis results for the gate insulating film of the conventional silicon carbide semiconductor device.

FIG. 15 is a graph showing composition analysis results for the gate insulating film of the conventional silicon carbide semiconductor device. In FIG. 15 are the results of analysis of the composition of the SiO$_2$/SiC interface by TEM-EDX in an instance in which the gate insulating film 109 is formed by an HTO. In FIG. 15, a horizontal axis indicates depth from a predetermined position of SiC in units of nm. A vertical axis indicates concentration of C, oxygen (O), and silicon (Si). In FIG. 15, a dotted line portion of a measurement position indicates the SiO$_2$/SiC interface.

Here, transmission electron microscopy (TEM) is a technique of irradiating a sliced specimen with an electron beam to form an image of electrons that have passed through the sample or scattered electrons for observation at high magnification. Further, energy dispersive x-ray spectroscopy (EDX) is a technique for performing elemental analysis and qualitative analysis by measuring the energy and number of generations of characteristic X-rays generated when a region to be analyzed is irradiated with electron beams. In FIG. 15, SiC is, for example, a p-type base layer 106.

As depicted in FIG. 15, even when the gate insulating film 109 is formed by thermal oxidation and not an HTO, the Si of the SiC is oxidized, excess C precipitates, and a region in which SiC crystals are disturbed is formed within a certain range from the surface. In FIG. 15, while a thickness of the region in which the SiC crystals are disturbed (transition layer) is 3.5 nm, when a same analysis was performed, the thickness of the transition layer was 3.9 nm and 4.4 nm. Therefore, the thickness of the transition layer may be estimated to be 3.9 nm on average. Further, the $SiO_2/SiC$ interface is in a center of the transition layer and therefore, the region in which the SiC crystals are disturbed is formed within a range of about 2 nm from the $SiO_2/SiC$ interface.

Further, while the initial oxidation of film formation differs somewhat due to HTO equipment and film formation conditions, complete suppression thereof is usually impossible. In a conventional method of processing in an order of HTO/NO, during HTO film formation, the SiC surface is oxidized about 2 nm. Furthermore, by the subsequent NO annealing, O reaches the interface and is further oxidized, whereby the amount of oxidation increases.

In the trench-type MOSFET, current that flows in the channel is thought to be about 2 nm to 5 nm from the trench sidewalls. The initial oxidation of HTO film formation is about 2 nm and therefore, current flows in a portion having crystal damage, affecting the characteristics. Therefore, to further improve device element characteristics, it is important to not allow oxidation of the SiC of the trench sidewalls at portions forming the channel. Oxidation is impossible to completely suppress and therefore, a challenge in enhancing electrical characteristics is to not allow excess C to remain at the $SiO_2/SiC$ interface or in the HTO film as far as possible. Further, nitriding the interface a suitable amount is effective in improving the characteristics and therefore, a manufacturing process that reduces nitrogen escape from the interface is important. From analysis, it is found that with a process that performs NO annealing of Japanese Laid-Open Patent Publication No. 2019-145570 before HTO film formation, N escapes from the interface.

Embodiments of a silicon carbide semiconductor device and a method of manufacturing a silicon carbide semiconductor device according to the present invention are described with reference to the accompanying drawings. In the present description and accompanying drawings, layers and regions prefixed with n or p mean that majority carriers are electrons or holes, respectively. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
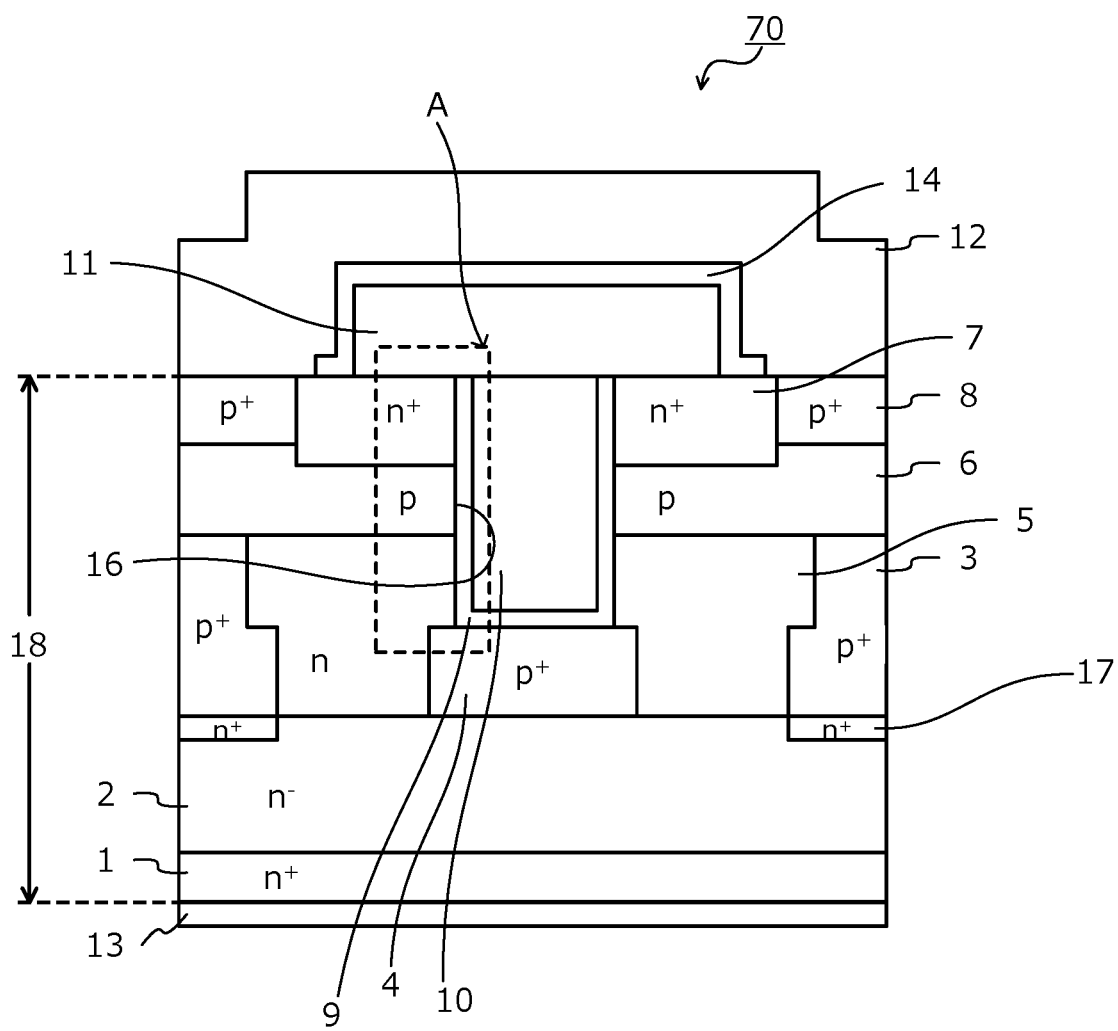
FIG. 1 is a cross-sectional view depicting a structure of a silicon carbide semiconductor device according to an embodiment.

A semiconductor device according to the present invention is configured using a wide bandgap semiconductor. In an embodiment, a silicon carbide semiconductor device fabricated (manufactured) using, for example, silicon carbide (SiC) as a wide bandgap semiconductor is described taking a trench-type MOSFET 70 as an example. FIG. 1 is a cross-sectional view depicting a structure of a silicon carbide semiconductor device according to the embodiment. In FIG. 1, only an active region through which a main current of the trench-type MOSFET 70 flows is depicted.

As depicted in FIG. 1, in the silicon carbide semiconductor device according to the embodiment, on a first main surface (front surface), for example, a (0001) plane (Si-face) of an $n^+$-type silicon carbide substrate (silicon carbide semiconductor substrate of a first conductivity type) 1, an $n^-$-type silicon carbide epitaxial layer (first semiconductor layer of the first conductivity type) 2 is deposited.

The $n^+$-type silicon carbide substrate 1 is a silicon carbide single crystal substrate. The $n^-$-type silicon carbide epitaxial layer 2 has an impurity concentration lower than an impurity concentration of the $n^+$-type silicon carbide substrate 1 and, for example, is a low-concentration n-type drift layer. At a surface of the $n^-$-type silicon carbide epitaxial layer 2 opposite to a surface thereof facing the $n^+$-type silicon carbide substrate 1, n-type high-concentration regions 5 may be formed. The n-type high-concentration regions 5 form a high-concentration n-type drift layer having an impurity concentration lower than that of the $n^+$-type silicon carbide substrate 1 and higher than that of the $n^-$-type silicon carbide epitaxial layer 2.

At a surface of the $n^-$-type silicon carbide epitaxial layer 2 opposite to a surface thereof facing the $n^+$-type silicon carbide substrate 1, a p-type base layer (second semiconductor layer of a second conductivity type) 6 is provided. Hereinafter, the $n^+$-type silicon carbide substrate 1, the $n^-$-type silicon carbide epitaxial layer 2, the n-type high-concentration regions 5, and the p-type base layer 6 combined are assumed as a silicon carbide semiconductor base (semiconductor substrate containing silicon carbide) 18.

On a second main surface of the $n^+$-type silicon carbide substrate 1 (back surface, i.e., a back surface of the silicon carbide semiconductor base 18), a drain electrode that is a back electrode (second electrode) 13 is provided. On a surface of the back electrode 13, a drain electrode pad (not depicted) is provided.

In the silicon carbide semiconductor base 18 at the first main surface thereof (surface of the p-type base layer 6), a trench structure is formed. In particular, from a surface (first main surface of the silicon carbide semiconductor base 18) of the p-type base layer 6 opposite to a surface thereof facing the $n^+$-type silicon carbide substrate 1, trenches 16 penetrate through the p-type base layer 6 and reach the n-type high-concentration regions 5 (in an instance in which the n-type high-concentration regions 5 are omitted, the $n^-$-type silicon carbide epitaxial layer 2, hereinafter indicated as simply "(2)"). Along inner walls of the trenches 16, a gate insulating film 9 is formed on bottoms and sidewalls of the trenches 16, and gate electrodes 10 are formed on the gate insulating film 9 in the trenches 16. The gate electrodes 10 are insulated from the n-type high-concentration regions 5(2) and the p-type base layer 6 by the gate insulating film 9. The gate electrodes 10 may partially protrude toward a source electrode (first electrode) 12, from tops (sides facing the later described source electrode 12) of the trenches 16. Further, the gate insulating film 9 may be formed on an m-plane. For example, in an instance in which the trench structure is formed, the sidewalls of the trenches 16 may preferably be an m-plane.

In a surface layer of each of the n-type high-concentration regions 5(2) at a surface thereof (first main surface of the silicon carbide semiconductor base 18) opposite to a surface thereof facing the n$^+$-type silicon carbide substrate 1, a first p$^+$-type base region 3 is provided between the trenches 16. Further, in the n-type high-concentration regions 5(2), second p$^+$-type base regions 4 respectively in contact with the bottoms of the trenches 16 are provided. The second p$^+$-type base regions 4 are provided at positions facing the bottoms of the trenches 16 in a depth direction (direction from the source electrode 12 toward the back electrode 13). A width of the second p$^+$-type base regions 4 is wider than a width of each of the trenches 16. The bottoms of the trenches 16 may reach the second p$^+$-type base regions 4 or may be positioned in the n-type high-concentration regions 5(2) that are sandwiched between the p-type base layer 6 and the second p$^+$-type base regions 4.

Further, in the n$^-$-type silicon carbide epitaxial layer 2, at positions deeper than the first p$^+$-type base regions 3 between the trenches 16, n$^+$-type regions 17 having a peak impurity concentration higher than a peak impurity concentration of the n-type high-concentration regions 5(2) are provided. A deep position is a position closer to the back electrode 13 than are the first p$^+$-type base regions 3.

In the p-type base layer 6, at the first main surface of the silicon carbide semiconductor base 18, n$^+$-type source regions (first semiconductor regions of the first conductivity type) 7 are selectively provided. Further, p$^+$-type contact regions (second semiconductor regions of the second conductivity type) 8 may be selectively provided. Further, the n$^+$-type source regions 7 and the p$^+$-type contact regions 8 are in contact with one another.

An interlayer insulating film 11 is provided in an entire area of the first main surface of the silicon carbide semiconductor base 18, so as to cover the gate electrodes 10 embedded in the trenches 16. The source electrode 12 is in contact with the n$^+$-type source regions 7 and the p-type base layer 6 via contact holes opened in the interlayer insulating film 11. Further, in an instance in which the p$^+$-type contact regions 8 are provided, the source electrode 12 is in contact with the n$^+$-type source regions 7 and the p$^+$-type contact regions 8. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 to the gate electrodes 10 may be provided.

Figure 2:
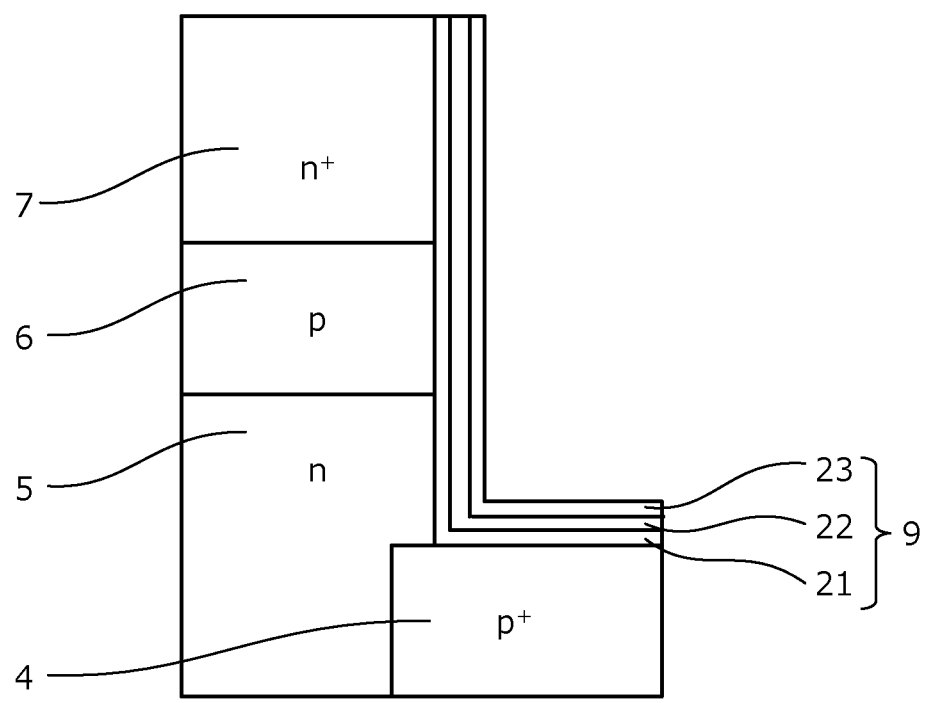
FIG. 2 is a cross-sectional view depicting a trench gate structure of the silicon carbide semiconductor device according to the embodiment.

FIG. 2 is a cross-sectional view depicting the trench gate structure of the silicon carbide semiconductor device according to the embodiment. FIG. 2 is an enlarged view of a region surrounded by dotted line A in FIG. 1. As depicted in FIG. 2, the gate insulating film 9 is configured by three layers including a first gate insulating film 21, a second gate insulating film 22, and a third gate insulating film 23. The first gate insulating film 21 is provided on a front surface of a silicon carbide layer (the second p$^+$-type base regions 4, the n-type high-concentration regions 5, the p-type base layer 6, and the n$^+$-type source regions 7); the second gate insulating film 22 is provided on a surface of the first gate insulating film 21 opposite to a surface of the first gate insulating film 21 facing the silicon carbide layer, the third gate insulating film 23 is provided on a surface of the second gate insulating film 22 opposite to a surface of the second gate insulating film 22 facing the second gate insulating film 22, and the gate electrodes 10 are provided on a surface of the third gate insulating film 23 opposite to a surface of the third gate insulating film 23 facing the second gate insulating film 22.

The gate insulating film 9 of the embodiment, as described hereinafter, is formed by three processes including a first NO annealing, an oxide film formation, and a second NO annealing. The first gate insulating film 21 is formed by the first NO annealing and is a silicon nitride (SiN) layer having a thickness of at most 1 nm. The second gate insulating film 22 is a thermal oxide film formed by the first NO annealing and is a silicon oxide (SiO$_2$) film. The third gate insulating film 23 is a deposited film formed by oxide film formation by a HTO and the second NO annealing, and is a silicon oxide (SiO$_2$) film having a nitrogen (N) area density lower than that of the second gate insulating film 22. The second gate insulating film 22 may have a film thickness that is thinner than that of the third gate insulating film 23 and that may be at most 1 nm, preferably.

Further, the first gate insulating film 21 may have a nitrogen area density that is preferably higher than $3.7 \times 10^{14}$/cm$^2$, or more preferably at least $4.0 \times 10^{14}$/cm$^2$ measured by x-ray photoelectron spectroscopy (XPS). Further, the first gate insulating film 21 has a nitrogen concentration that preferably may be at least $7.0 \times 10^{20}$ atoms/cm$^3$ where a highest concentration is measured by secondary ion mass spectrometry (SIMS).

The second gate insulating film 22 and the third gate insulating film 23 may preferably have a mixture of nitrogen of an amount in a range from $5.0 \times 10^{18}$ atoms/cm$^3$ to $2.0 \times 10^{20}$ atoms/cm$^3$, preferably. In a SiO$_2$ film that is a combination of the second gate insulating film 22 and the third gate insulating film 23, the nitrogen concentration is highest at an interface with the second gate insulating film 22, and the nitrogen concentration is lowest at interfaces with the gate electrodes 10.

Figure 13:
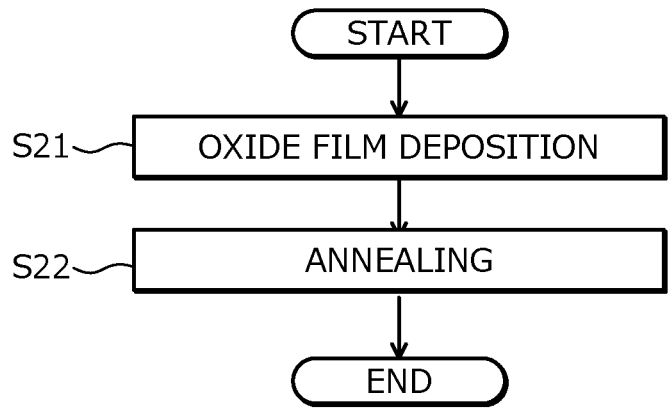
FIG. 13 is a flowchart of a method of manufacturing the gate insulating film of the conventional silicon carbide semiconductor device.
Figure 14:
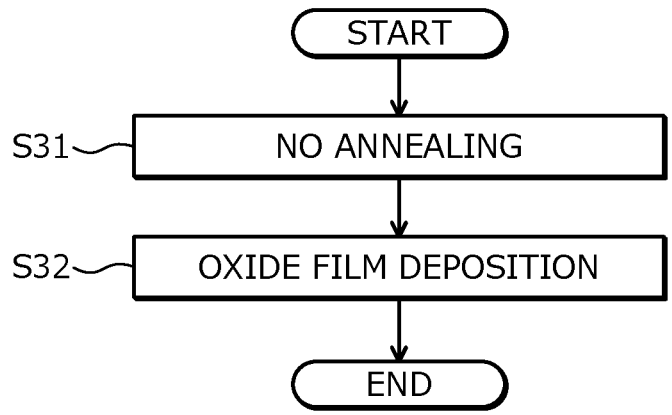
FIG. 14 is a flowchart of an improved method of manufacturing the gate insulating film of the conventional silicon carbide semiconductor device.

FIG. 3 is a table of measurement results for the gate insulating film according to the embodiment and conventional gate insulating films, by secondary ion mass spectrometry and x-ray photoelectron spectroscopy. Here, for the gate insulating film 9 of the embodiment, the conventional gate insulating film 109 by the method of manufacturing in FIG. 13 (first conventional example), and the conventional gate insulating film 109 by the method of manufacturing in FIG. 14 (second conventional example), secondary ion mass spectrometry measurement results for the N concentration and x-ray photoelectron spectroscopy measurement results for N area density of a SiC surface are indicated below. Here, an oxide film is a deposited film formed by an HTO; after SIMS analysis, the SiO$_2$ film is peeled by hydrogen fluoride (HF) and XPS measurement is performed. Therefore, in the SIMS analysis, the N concentration and the N concentration of an interface in a HTO film (oxide film formed by an HTO) may be measured and XPS may measure the N area density of the SiC interface from which the SiO$_2$ film was removed.

As depicted in FIG. 3, from the results of the SIMS analysis, it was confirmed that with the sequence of the NO annealing/HTO film formation of the second conventional example, N desorbs from the interface, is diffused in the HTO film, and N escapes from the surface. Therefore, in the embodiment, by performing two sessions of the NO annealing, the escape of N from the surface is prevented. In the embodiment, as compared to the first conventional example, the N concentration in the HTO film is higher toward the interface and lower toward the surface, and N does not easily escape. Further, as described hereinafter, while a total time of 15 minutes (first session: 5 minutes, second session: 10 minutes) of the NO annealing is less than the 30 minutes for the first conventional example, the N amount of the surface is about equal to that conventionally and the oxidation amount of the SiC surface by thermal oxidation is reduced. The N area density of the interface by XPS measurement is higher in the embodiment than in the first and the second conventional examples and this difference of the N area densities of the surfaces affects electrical characteristics of the device.

FIG. 4 is a table of electrical characteristics of the silicon carbide semiconductor device according to the embodiment and the conventional silicon carbide semiconductor device. As depicted in FIG. 4, in the silicon carbide semiconductor device according to the embodiment, while mobility decreases about 12%, threshold voltage improves 28%. In this manner, in the embodiment, while there is a slight decrease in mobility, the amount of decrease is suppressed as much as possible and the threshold voltage may be increased 1.13V. Here, while a higher threshold voltage is desirable, threshold voltage and mobility have a tradeoff relationship, suppressing decrease of mobility as much as possible and improving threshold voltage may be preferable as practical characteristics of the SiC-MOSFET.

In this manner, in the embodiment, the gate insulating film 9 is formed by the three layers: the first gate insulating film 21, the second gate insulating film 22, and the third gate insulating film 23. Due to the second gate insulating film 22, damage (excess C, crystal disorder of the interface, etc.) caused by initial oxidation of the third gate insulating film 23 is suppressed and oxidation of the SiC of the sidewalls of the trenches 16 forming a channel decreases. Therefore, device element characteristics that degrade due to disturbance and/or damage of the $SiO_2$/SiC interface may be improved. For example, the threshold voltage may be improved while mobility is prevented from decreasing as much as possible.

Next, a method of manufacturing the silicon carbide semiconductor device according to the embodiment is described. FIGS. 5, 6, 7, 8, and 9 are cross-sectional views depicting states of the silicon carbide semiconductor device according to the embodiment during manufacture.

Figure 5:
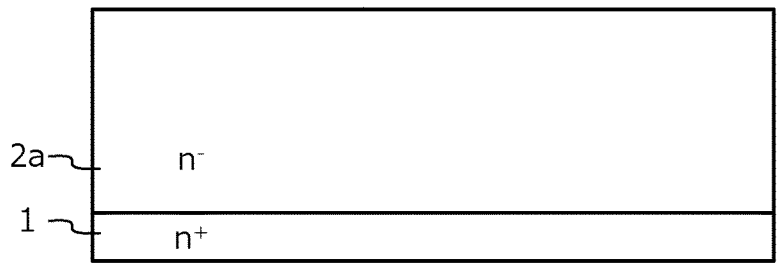
FIG. 5 is a cross-sectional view depicting a state of the silicon carbide semiconductor device according to the embodiment during manufacture.

First, the $n^+$-type silicon carbide substrate 1 containing an n-type silicon carbide is prepared. Then, on the first main surface of the $n^+$-type silicon carbide substrate 1, a lower $n^-$-type silicon carbide epitaxial layer 2a containing silicon carbide is epitaxially grown to have a thickness of, for example, about 30 μm while an n-type impurity, for example, nitrogen atoms (N), is doped. The state up to here is depicted in FIG. 5.

Next, on a surface of the lower n~-type silicon carbide epitaxial layer 2a, a non-depicted mask having predetermined openings is formed by a photolithographic technique using, for example, an oxide film. Then, by an ion implantation using the oxide film as a mask, an n-type impurity, for example, nitrogen atoms may be ion implanted. Thus, the $n^+$-type regions 17 may be formed in the lower $n^-$-type silicon carbide epitaxial layer 2a.

Next, the mask used during the ion implantation for forming the $n^+$-type regions 17 is removed. Next, an implantation mask having predetermined openings is formed by a photolithographic technique using, for example, an oxide film. Then, a p-type impurity such as aluminum is ion implanted in the openings of the oxide film, whereby lower first $p^+$-type base regions 3a and the second $p^+$-type base regions 4 of a depth of about 0.5 μm are formed. In an instance in which the $n^+$-type regions 17 are formed, on surfaces of the $n^+$-type regions 17 opposite to surfaces thereof facing the $n^+$-type silicon carbide substrate 1, the lower first $p^+$-type base regions 3a are formed so as to overlap the $n^+$-type regions 17.

Figure 6:
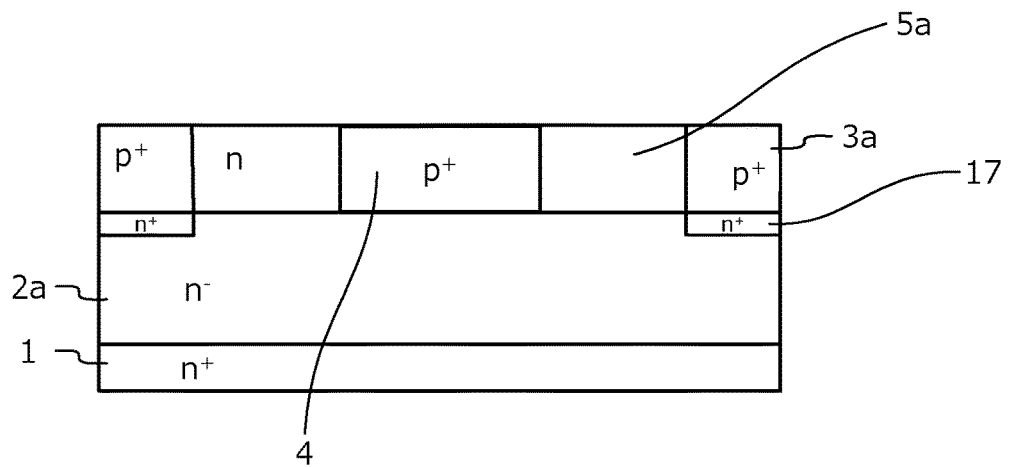
FIG. 6 is a cross-sectional view depicting a state of the silicon carbide semiconductor device according to the embodiment during manufacture.

Next, portions of the ion implantation mask may be removed, an n-type impurity such as nitrogen may be ion implanted in the openings, whereby in portions of a surface region of the lower $n^-$-type silicon carbide epitaxial layer 2a, lower n-type high-concentration regions 5a of a depth of, for example, about 0.5 μm may be formed. An impurity concentration of the lower n-type high-concentration regions 5a is set to, for example, about $1\times10^{17}/cm^3$. The state up to here is depicted in FIG. 6.

Next, on a surface of the lower $n^-$-type silicon carbide epitaxial layer 2a, an upper $n^-$-type silicon carbide epitaxial layer 2b doped with an n-type impurity such as nitrogen is formed having a thickness of about 0.5 μm. An impurity concentration of the upper $n^-$-type silicon carbide epitaxial layer 2b is set to become about $3\times10^{15}/cm^3$. Hereinafter, the lower $n^-$-type silicon carbide epitaxial layer 2a and the upper $n^-$-type silicon carbide epitaxial layer 2b combined are the the $n^-$-type silicon carbide epitaxial layer 2.

Next, on a surface of the upper $n^-$-type silicon carbide epitaxial layer 2b, an ion implantation mask having predetermined openings is formed by photolithography using, for example, an oxide film. Then, a p-type impurity such as aluminum is ion implanted in the openings of the oxide film and upper first $p^+$-type base regions 3b of a depth p about 0.5 μm are formed so as to overlap the lower first $p^+$-type base regions 3a. The upper first $p^+$-type base regions 3b and the lower first $p^+$-type base regions 3a form continuous regions respectively forming the first $p^+$-type base regions 3. An impurity concentration of the upper first $p^+$-type base regions 3b is set to become, for example, about $5\times10^{18}/cm^3$.

Figure 7:
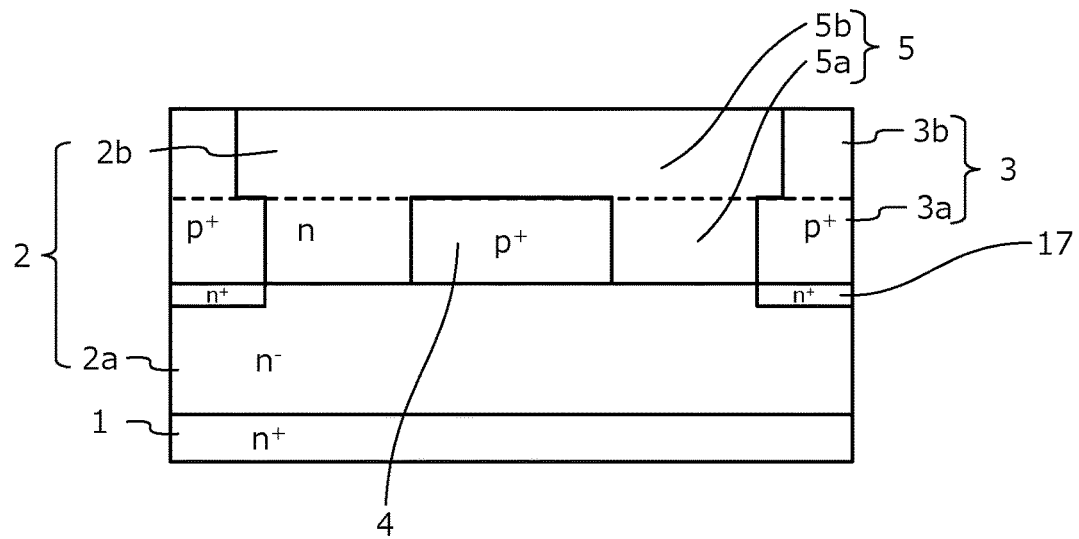
FIG. 7 is a cross-sectional view depicting a state of the silicon carbide semiconductor device according to the embodiment during manufacture.

Next, portions of the ion implantation mask may be removed, an n-type impurity such as nitrogen may be ion implanted in the openings, and in portions of a surface region of the $n^-$-type silicon carbide epitaxial layer 2, upper n-type high-concentration regions 5b of a depth of, for example, about 0.5 μm may be formed. An impurity concentration of the upper n-type high-concentration regions 5b may be set to, for example, about $1\times10^{17}/cm^3$. The upper n-type high-concentration regions 5b and the lower n-type high-concentration regions 5a are formed to at least partially contact one another and form the n-type high-concentration regions 5. Nonetheless, there are instances in which the n-type high-concentration regions 5 are formed in an entire area of the substrate surface and instances in which the n-type high-concentration regions 5 are omitted. The state up to here is depicted in FIG. 7.

Next, on a surface of the $n^-$-type silicon carbide epitaxial layer 2, the p-type base layer 6 is formed by epitaxial growth to have a thickness of about 1.1 μm. An impurity concentration of the p-type base layer 6 is set to about $4\times10^{17}/cm^3$. After the p-type base layer 6 is formed by epitaxial growth, the p-type base layer 6 may be further ion implanted with a p-type impurity such as aluminum.

Next, in a first main surface layer of the silicon carbide semiconductor base 18 (surface layer of the p-type base layer 6), predetermined regions configuring the MOS gates are formed. In particular, on the surface of the p-type base layer 6, an ion implantation mask having predetermined openings is formed by photolithography using, for example, an oxide film. An n-type impurity such as nitrogen (N), phosphorus (P), etc. is ion implanted in the openings, whereby the $n^+$-type source regions 7 are formed in portions of the p-type base layer 6 at the surface of the p-type base layer 6. Next, the ion implantation mask used to form the n$^+$-type source regions 7 is removed and by a similar method, an ion implantation mask having predetermined openings may be formed, a p-type impurity such as boron may be ion implanted in portions of the p-type base layer 6 at the surface of the p-type base layer 6, whereby the p$^+$-type contact regions 8 may be formed. An impurity concentration of the p$^+$-type contact regions 8 is set to be higher than the impurity concentration of the p-type base layer 6.

Figure 8:
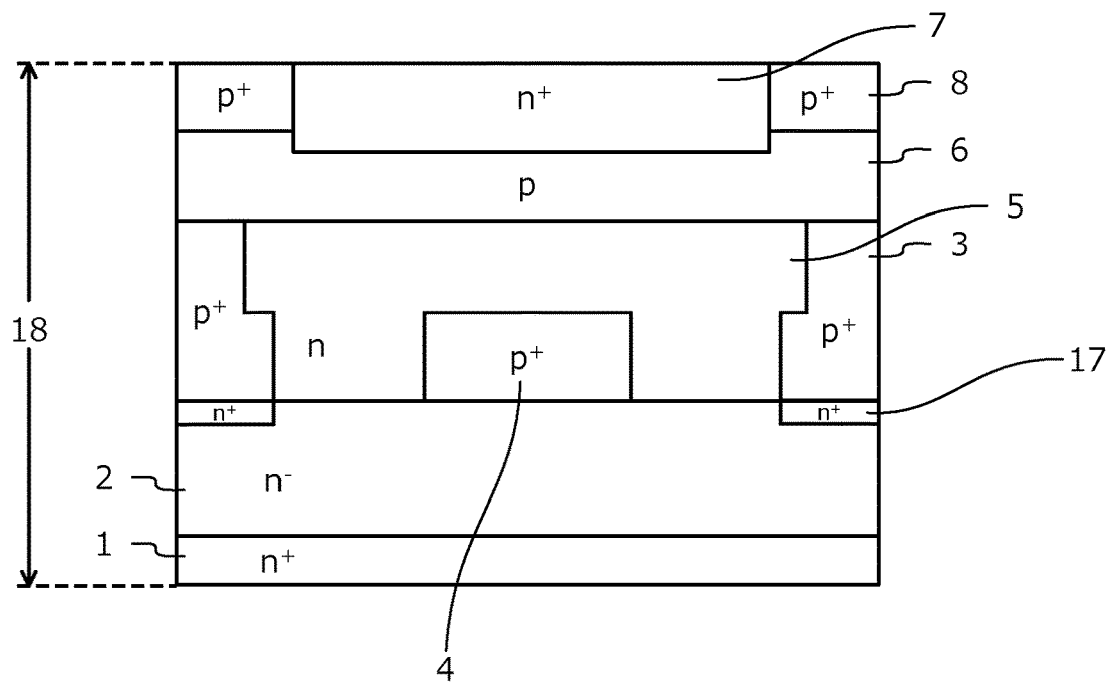
FIG. 8 is a cross-sectional view depicting a state of the silicon carbide semiconductor device according to the embodiment during manufacture.

Next, a heat treatment for activating all regions formed by ion implantation (activation annealing) is performed. For example, a heat treatment (annealing) under an inert gas atmosphere of a temperature of about 1700 degrees C. is performed, thereby implementing an activation process for the first p$^+$-type base regions 3, the second p$^+$-type base regions 4, the n$^+$-type source regions 7, the p$^+$-type contact regions 8, and the n$^+$-type regions 17. As described above, ion implanted regions may be activated collectively by a single session of the heat treatment or may be activated by performing the heat treatment each time the ion implantation is performed. The state up to here is depicted in FIG. 8.

Next, on the surface of the p-type base layer 6, a trench formation mask having predetermined openings is formed by photolithography using, for example, an oxide film. Next, by dry etching, the trenches 16 that penetrate through the p-type base layer 6 and reach the n-type high-concentration regions 5(2) are formed. The bottoms of the trenches 16 may reach the second p$^+$-type base regions 4 formed in the n-type high-concentration regions 5(2). Next, the trench formation mask is removed. Next, the front surface of the silicon carbide semiconductor base 18 is cleaned by, for example, RCA cleaning (wet cleaning with strong acid and high base solutions).

Figure 10:
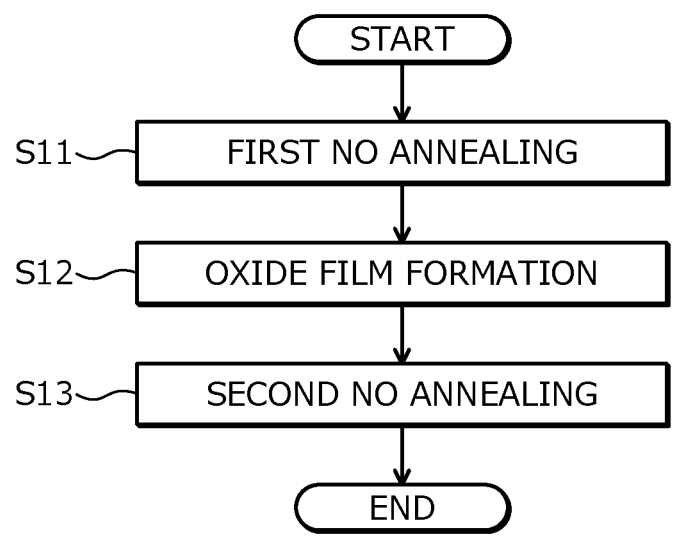
FIG. 10 is a flowchart of a method of manufacturing the gate insulating film of the silicon carbide semiconductor device according to the embodiment.

Next, along surfaces of the n$^+$-type source regions 7 and along the bottoms and the sidewalls of the trenches 16, the gate insulating film 9 is formed. Here, a method of manufacturing the gate insulating film 9 of the embodiment is described in detail. FIG. 10 is a flowchart of a method of manufacturing the gate insulating film of the silicon carbide semiconductor device according to the embodiment. In the embodiment, a front surface of a semiconductor layer (the first p$^+$-type base regions 3, the n-type high-concentration regions 5, the p-type base layer 6, and the n$^+$-type source regions 7) of the sidewalls of the trenches 16 is assumed to be an m-plane.

Next, on the front surface of the silicon carbide layer, the first NO annealing is performed (step S11). The first NO annealing is performed at a temperature in a range from 1200 degrees to less than 1300 degrees C., by a NO (nitric oxide) 10%/N$_2$ (nitrogen) gas (NO is 10% and a remaining 90% is N$_2$ gas, similarly hereinafter) for 5 minutes to 10 minutes. As a result, the front surface of the silicon carbide layer is nitrided and thermally oxidized, forming the first gate insulating film 21 that is a nitride film, and the second gate insulating film 22 that is a SiO$_2$ film thermally oxidized and having a thickness of about 1 nm. The first NO annealing is performed for a shorter time and at a lower temperature than conventionally, whereby the oxidation amount (film thickness) when the SiC trench sidewalls are nitrided and oxidized is minimized and damage of the SiC surface (excess C, crystal disorder of the interface, etc.) due to oxidation is reduced as much as possible. The oxide film formed by this oxidation becomes a SiO$_2$ film having high density and favorable quality.

Next, an oxide film is deposited as a HTO (step S12). The HTO may be formed by a high temperature oxidation performed at a temperature of 800 degrees C. with introduction of dichlorosilane (DCS) and N$_2$O. Instead of the DCS, monosilane (SiH$_4$) may be used. In this case, a temperature of furnace insertion is 600 degrees C. and for about one hour the temperature is raised and evacuation is performed. As a result, the third gate insulating film 23 having a thickness in a range from 60 nm to 80 nm is formed.

Here, the initial oxidation that occurs due to HTO film formation is significantly reduced due to an oxide film and nitride layer formed by the first NO annealing. The HTO film formation forms a SiO$_2$ film having a density lower than that of the oxide film formed by the first NO annealing.

Next, the second NO annealing is performed (step S13). The second NO annealing is performed 50 degrees C. to 100 degrees C. higher than the first NO annealing and is performed at a temperature in a range from about 1300 degrees C. to 1330 degrees C. by a NO10%/N$_2$ gas for a time period longer than that of the first NO annealing and is performed for 5 minutes to 15 minutes. The combined time of the first NO annealing and the second NO annealing may be preferably at most 30 minutes.

Figure 9:
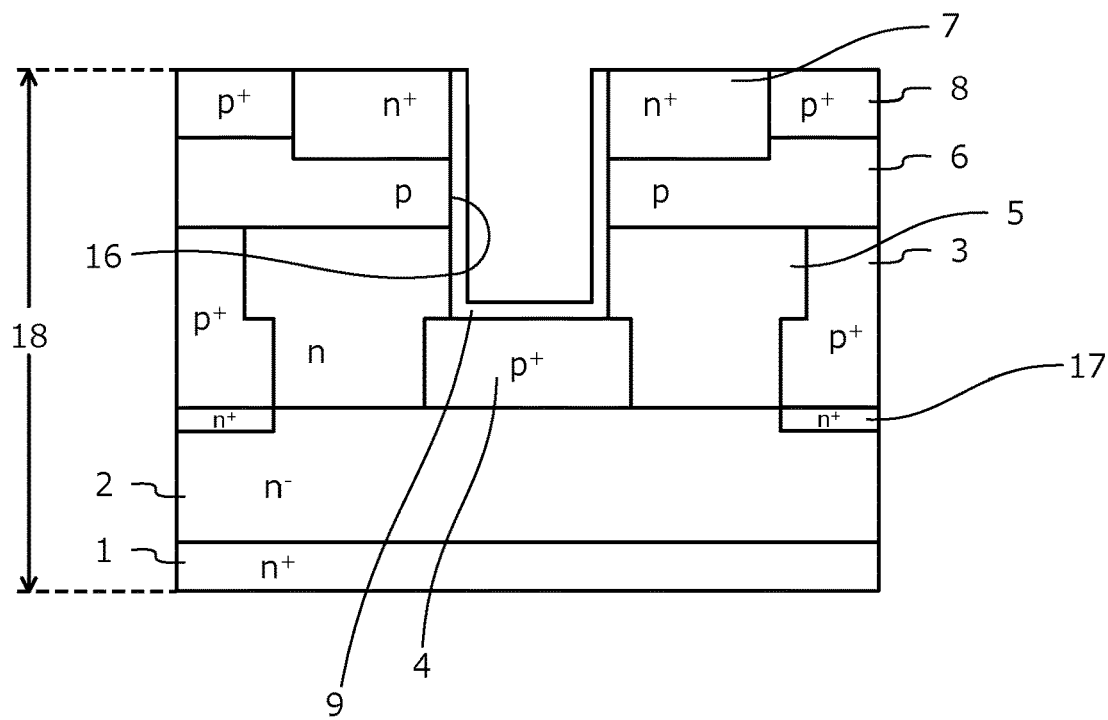
FIG. 9 is a cross-sectional view depicting a state of the silicon carbide semiconductor device according to the embodiment during manufacture.

By the HTO, N escapes from the surface of the SiC nitride by the first NO annealing and therefore, to again accumulate N at the interface, the second NO annealing is performed. The second NO annealing is performed at temperature higher than that of the first NO annealing, whereby the interface may be again sufficiently nitrided, and the interface between the gate insulating film and the SiC may be nitrided by a suitable amount. To minimize additional oxidation of the SiC interface due to NO, the total heat treatment time of the first NO annealing and the second NO annealing may be preferably shorter than the time of the conventional NO annealing (step S22 in FIG. 13) performed after the oxide film deposition. Thus, the gate insulating film 9 is formed. The state up to here is depicted in FIG. 9.

Further, the second NO annealing may be performed in multiple sessions by dividing the time period. Moreover, the NO concentration in the first NO annealing may differ from that in the second NO annealing. In this instance, the concentration in the first NO annealing is lower and the characteristics are enhanced. For example, preferably, the first NO annealing may be performed by a NO8%/N$_2$ gas and the second NO annealing may be performed by a NO12%/N$_2$ gas.

Next, on the gate insulating film 9, a polycrystalline silicon layer doped with, for example, phosphorus atoms is provided. The polycrystalline silicon layer may be formed so as to be embedded in the trenches 16. The polycrystalline silicon layer is patterned by photolithography and left in the trenches 16, whereby the gate electrodes 10 are formed.

Next, for example, phosphate glass is deposited so as to cover the gate insulating film 9 and the gate electrodes 10 and have a thickness of about 1 μm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating film 9 are patterned by photolithography, forming contact holes in which the n$^+$-type source regions 7 and the p$^+$-type contact regions 8 are exposed. Thereafter, a heat treatment (reflow) is performed, planarizing the interlayer insulating film 11.

Next, the interlayer insulating film 11 is selectively removed and a nickel (Ni) or Ti film is formed on a surface of the silicon carbide semiconductor base 18. Next, surfaces are protected and a Ni or Ti film is formed on a back side of the n$^+$-type silicon carbide substrate 1. Next, a heat treatment of about 1000 degrees C. is performed, thereby forming ohmic electrodes on a front side of the silicon carbide semiconductor base 18 and a back side that is a back surface of the n$^+$-type silicon carbide substrate 1.

Next, a conductive film that becomes the source electrode 12 is provided so as to be in contact with an ohmic electrode portion formed in the described contact holes and on the interlayer insulating film 11, and the n$^+$-type source regions 7 and the p$^+$-type contact regions 8 are put in contact with the source electrode 12.

Subsequently, on the second main surface of the n$^+$-type silicon carbide substrate 1, for example, the back electrode 13 that is a nickel (Ni) film is formed. Thereafter, for example, a heat treatment is performed at a temperature of about 970 degrees C., whereby the n$^+$-type silicon carbide substrate 1 and the back electrode 13 become in ohmic contact.

Next, for example, by a sputtering technique, in the openings of the interlayer insulating film 11 and on the source electrode 12 of the front surface of the silicon carbide semiconductor base 18, an electrode pad that becomes the source electrode pad (not depicted) is deposited. A thickness of a portion of the electrode pad on the interlayer insulating film 11, for example, may be 5 μm. The electrode pad, for example, may be formed using aluminum containing silicon at a rate of 1% (Al—Si). Next, the source electrode pad is selectively removed.

Next, on a surface of the back electrode 13, for example, titanium (Ti), nickel (Ni), and gold (Au) are sequentially deposited as the drain electrode pad (not depicted). As described above, the semiconductor device depicted in FIG. 1 is completed.

Figure 11:
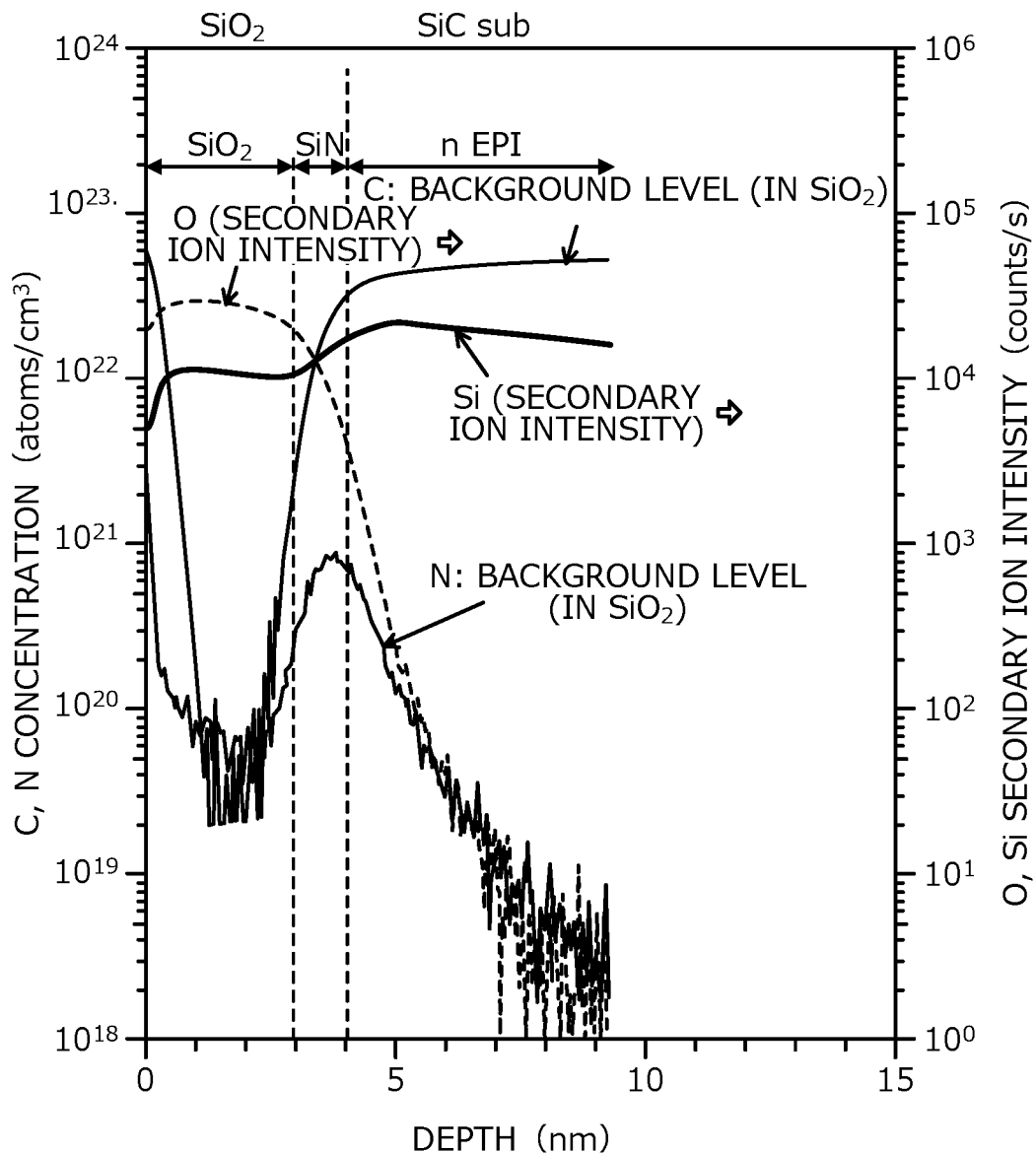
FIG. 11 is a graph depicting results of SIMS analysis at a silicon carbide interface after NO annealing.

FIG. 11 is a graph depicting results of SIMS analysis at the silicon carbide interface after NO annealing. In FIG. 11, a horizontal axis indicates depth from a predetermined position of SiC in units of nm. A left vertical axis indicates concentration of C and N in units of atoms/cm$^3$. A right vertical axis indicates secondary ion intensity of O and Si in units of counts/s. FIG. 11 depicts results of SIMS analysis near the SiC interface when the NO annealing is performed at a temperature of 1300 degrees C. by a NO10%/N$_2$ gas for 30 minutes. As depicted in FIG. 11, at the SiC surface, a SiN layer of about 1 nm and a SiO$_2$ film of about 3 nm due to thermal oxidation, are formed. On the other hand, in the embodiment, the first NO annealing is performed in a range from 1200 degrees C. to less than 1300 degrees C. and for 5 minutes to 10 minutes and therefore, the temperature is lower and the period of time is from ⅙ to ⅓, whereby the SiO$_2$ film (the second gate insulating film 22) is formed thinly to be at most 1 nm.

Further, while nitriding and oxidation occur concurrently at the SiC surface, the amount of oxidation by the first NO annealing is at most about 1 nm and is less than the amount of initial oxidation of a HTO, which is about 2 nm. After the first NO annealing, the HTO film formation is performed; however, the thermally oxidized SiO$_2$ film (the second gate insulating film 22) is present and therefore, there is substantially no initial oxidation of the HTO and the amount of additional oxidation of the SiC interface due to the second NO annealing is also reduced.

As described above, according to the embodiment, the gate insulating film is assumed to be three-layered including the first gate insulating film, the second gate insulating film, and the third gate insulating film. Initial oxidation of the third gate insulating film is suppressed by the second gate insulating film, and damage (excess C, crystal disorder of the interface, etc.) that occurs due to oxidation of SiC of the sidewalls of the trenches forming a channel is reduced.

Further, according to the embodiment, the gate insulating film is formed by the first NO annealing, deposition of an oxide film by a HTO, and the second NO annealing. The first NO annealing is performed for a short period and at a low temperature, whereby the first gate insulating film and the second gate insulating film are formed. The initial oxidation that occurs with the HTO film formation is significantly reduced by the first gate insulating film and the second gate insulating film. N may be again accumulated at the interface by the second NO annealing. As a result, oxidation of the SiC surface is minimized, occurrences of crystal disorder of the interface and excess C are suppressed, and the interface between the gate insulating film and SiC may be nitrided a suitable amount. Therefore, device element characteristics that are degraded due to disturbance and/or damage of the SiO$_2$/SiC interface may be improved. For example, the threshold voltage may be improved while mobility is prevented from decreasing as much as possible.

In the foregoing, the present invention may be variously modified within a range not departing from the spirit of the invention and in the embodiments described above, for example, dimensions, impurity concentrations, etc. of regions may be variously set according to necessary specifications. Further, in the embodiment described above, while an instance in which silicon carbide is used as a wide bandgap semiconductor is described as an example, a wide bandgap semiconductor other than silicon carbide, such as, for example, gallium nitride (GaN) is further applicable. Further, a semiconductor other than a wide bandgap semiconductor such as silicon (Si), germanium (Ge), etc. is further applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the gate insulating film is formed by the first NO annealing, deposition of an oxide film by a HTO, and the second NO annealing. The first NO annealing is performed for a short period and at a low temperature, whereby the first gate insulating film and the second gate insulating film are formed. The initial oxidation that occurs with the HTO film formation is significantly reduced by the first gate insulating film and the second gate insulating film. N may be again accumulated at the interface by the second NO annealing. As a result, oxidation of the SiC surface is minimized, occurrences of crystal disorder of the interface and excess C are suppressed, and the interface between the gate insulating film and SiC may be nitrided a suitable amount. Therefore, device element characteristics that are degraded due to disturbance and/or damage of the SiO$_2$/SiC interface may be improved. For example, the threshold voltage may be improved while mobility is prevented from decreasing as much as possible.

The silicon carbide semiconductor device and the method of manufacturing a silicon carbide semiconductor device according to the present invention achieve an effect in that device element characteristics that are degraded due to disturbance and/or damage of the SiO$_2$/SiC interface may be improved.

As described above, the silicon carbide semiconductor device and the method of manufacturing a silicon carbide semiconductor device according to the invention are useful for power semiconductor devices used in power converting equipment such as inverters, power source devices of various types of industrial machines, ignitors of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, having a first main surface and a second main surface opposite to each other;
a first semiconductor layer of the first conductivity type, provided on the first main surface of the silicon carbide semiconductor substrate, and having an impurity concentration lower than an impurity concentration of the silicon carbide semiconductor substrate, the first semiconductor layer having a first surface and a second surface opposite to each other, the second surface facing the silicon carbide semiconductor substrate;
a second semiconductor layer of a second conductivity type, provided on the first surface of the first semiconductor layer, the second semiconductor layer having a first surface and a second surface opposite to each other, the second surface of the second semiconductor layer facing the silicon carbide semiconductor substrate;
a first semiconductor region of the first conductivity type, selectively provided in the second semiconductor layer at the first surface of the second semiconductor layer;
a trench penetrating through the first semiconductor region and the second semiconductor layer, and reaching the first semiconductor layer;
a gate insulating film provided in the trench;
a gate electrode provided on the gate insulating film in the trench;
an interlayer insulating film provided on the gate electrode;
a first electrode provided on the second semiconductor layer and the first semiconductor region; and
a second electrode provided on the second main surface of the silicon carbide semiconductor substrate, wherein
the gate insulating film is configured by a first gate insulating film provided on a surface of a semiconductor body layer, a second gate insulating film provided on a first surface of the first gate insulating film opposite to a second surface of the first gate insulating film facing the semiconductor body layer, and a third gate insulating film provided on a first surface of the second gate insulating film opposite to a second surface of the second gate insulating film facing the semiconductor body layer, the semiconductor body layer being configured by the first semiconductor region, the second semiconductor layer, and the first semiconductor layer,
the first gate insulating film is a silicon nitride layer,
the second gate insulating film is a silicon oxide film, and
the third gate insulating film is a silicon oxide film having a nitrogen area density lower than a nitrogen area density of the second gate insulating film.

2. The silicon carbide semiconductor device according to claim 1, wherein
the first gate insulating film has a film thickness that is at most 1 nm,
the second gate insulating film has a film thickness thinner than a film thickness of the third gate insulating film,
the second gate insulating film is a thermal oxide film, and
the third gate insulating film is a deposited film.

3. The silicon carbide semiconductor device according to claim 1, wherein
the first gate insulating film has a nitrogen area density greater than $3.7 \times 10^{14}/cm^2$ measured by an x-ray photoelectron spectroscopy and a concentration of nitrogen at least $7.0 \times 10^{20}$ atoms/cm$^3$ where the concentration is highest measured by a secondary ion mass spectrometry.

4. The silicon carbide semiconductor device according to claim 1, wherein
the second gate insulating film and the third gate insulating film contain nitrogen in a range from $5.0 \times 10^{18}$ atoms/cm$^3$ to $2.0 \times 10^{20}$ atoms/cm$^3$.

5. The silicon carbide semiconductor device according to claim 1, wherein the second gate insulating film is provided directly on the first surface of the first gate insulating film, and the third gate insulating film is provided directly on the first surface of the second gate insulating film.

6. The silicon carbide semiconductor device according to claim 1, further comprising a second semiconductor region of the second conductivity type, selectively provided in the second semiconductor layer at the first surface of the second semiconductor layer, wherein
the first electrode is in direct contact with the first and second semiconductor regions.

7. A method of manufacturing the silicon carbide semiconductor device according to claim 1, the method comprising:
preparing the silicon carbide semiconductor substrate;
forming the first semiconductor layer on the first main surface of the silicon carbide semiconductor substrate;
forming the second semiconductor layer on the first surface of the first semiconductor layer;
selectively forming the first semiconductor region in the second semiconductor layer at the first surface of the second semiconductor layer;
forming the trench penetrating through the first semiconductor region and the second semiconductor layer, and reaching the first semiconductor layer;
forming the gate insulating film in the trench;
forming the gate electrode on the gate insulating film in the trench;
forming the interlayer insulating film on the gate electrode;
forming the first electrode on the second semiconductor layer and the first semiconductor region; and
forming the second electrode on the second main surface of the silicon carbide semiconductor substrate, wherein
forming the gate insulating film includes performing a heat treatment at least two times by a mixed gas containing nitric oxide and nitrogen to perform nitriding and oxidation of the semiconductor body layer, to form the gate insulating film.

8. The method according to claim 7, wherein
a temperature and a period of time a first time the heat treatment is performed are respectively lower than a temperature and shorter than a period of time a subsequent time the heat treatment is performed.

9. The method according to claim 7, wherein
forming the gate insulating film includes sequentially performing a first heat treatment by a first mixed gas of nitric oxide and nitrogen, deposition of an oxide film by a high temperature oxidation, and a second heat treatment by a second mixed gas of nitric oxide and nitrogen.

10. The method according to claim 9, wherein
a concentration of the nitric oxide of the first heat treatment is 8%, and
a concentration of the nitric oxide of the second heat treatment is 12%.

* * * * *